United States Patent
Verreck et al.

(10) Patent No.: US 10,211,287 B2
(45) Date of Patent: Feb. 19, 2019

(54) LAYERED STRUCTURE OF A P-TFET

(71) Applicants: IMEC VZW, Leuven (BE); Katholieke Universiteit Leuven, KU Leuven R&D, Leuven (BE)

(72) Inventors: Devin Verreck, Pellenberg (BE); Anne S. Verhulst, Houtvenne (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 14/880,667

(22) Filed: Oct. 12, 2015

(65) Prior Publication Data
US 2016/0104769 A1 Apr. 14, 2016

(30) Foreign Application Priority Data
Oct. 13, 2014 (EP) .................................. 14188713

(51) Int. Cl.
*H01L 29/06* (2006.01)
*H01L 29/08* (2006.01)
(Continued)

(52) U.S. Cl.
CPC ........ *H01L 29/0688* (2013.01); *H01L 27/092* (2013.01); *H01L 29/0847* (2013.01);
(Continued)

(58) Field of Classification Search
CPC ............... H01L 29/0688; H01L 29/365; H01L 29/66977; H01L 29/7391
See application file for complete search history.

(56) References Cited

U.S. PATENT DOCUMENTS 7,893,476 B2 * 2/2011 Verhulst ................. B82Y 10/00
257/296
8,072,012 B2 * 12/2011 Verhulst ................. B82Y 10/00
257/288
(Continued)

FOREIGN PATENT DOCUMENTS

EP        2528099 A1      11/2012

OTHER PUBLICATIONS

Vandenberghe, William; Verhulst, Anne S.; Groeseneken, Guido; Soree, Bart; Magnus, Wim. 2008 International Conference on Simulation of Semiconductor Processes and Devices: 137-40. IEEE. 2008.*
EP 14188713 European Search Report, dated Jan. 30, 2015.*

*Primary Examiner* — Meiya Li
*Assistant Examiner* — Shih Tsun A Chou
(74) *Attorney, Agent, or Firm* — Knobbe Martens Olson & Bear, LLP (57) ABSTRACT

A p-type Tunnel Field-Effect Transistor comprises a drain p-type semiconductor region, a source n-type semiconductor region, and at least one gate stack. The source n-type semiconductor region comprises a lowly doped section with a length of at least 10 nm and with a doping level of n-type dopant elements below $5\times10^{18}$ at/$cm^3$ and, in contact with the lowly doped section, a highly doped section with a length between 1 monolayer and 20 nm and with a doping level of n-type dopant elements above $5\times10^{18}$ at/$cm^3$.

14 Claims, 3 Drawing Sheets

(51) Int. Cl.
  *H01L 29/423* (2006.01)
  *H01L 27/092* (2006.01)
  *H01L 29/66* (2006.01)
  *H01L 29/78* (2006.01)
  *H01L 29/36* (2006.01)
  *H01L 29/739* (2006.01)

(52) U.S. Cl.
  CPC ........ *H01L 29/0895* (2013.01); *H01L 29/365* (2013.01); *H01L 29/42356* (2013.01); *H01L 29/66977* (2013.01); *H01L 29/7391* (2013.01); *H01L 29/78* (2013.01); *H01L 29/0665* (2013.01)

(56) References Cited

U.S. PATENT DOCUMENTS

| | | | | |
|---|---|---|---|---|
| 8,148,220 B2* | 4/2012 | Verhulst | ................ | B82Y 10/00 438/197 |
| 8,241,983 B2* | 8/2012 | Iacopi | ................ | H01L 29/7391 257/192 |
| 8,368,127 B2* | 2/2013 | Zhu | ................ | B82Y 10/00 257/288 |
| 8,369,134 B2* | 2/2013 | Singh | ................ | G11C 11/412 365/104 |
| 8,384,122 B1* | 2/2013 | Hu | ................ | H01L 29/7391 257/104 |
| 8,431,924 B2* | 4/2013 | Iacopi | ................ | H01L 29/7391 257/25 |
| 8,614,468 B2* | 12/2013 | van Dal | ................ | H01L 21/823807 257/288 |
| 8,816,326 B2* | 8/2014 | Yin | ................ | H01L 29/66462 257/24 |
| 8,890,118 B2* | 11/2014 | Chu-Kung | ................ | H01L 29/0843 257/24 |
| 8,921,174 B2* | 12/2014 | Huang | ................ | H01L 21/823892 257/E21.006 |
| 9,608,094 B2* | 3/2017 | Verhulst | ................ | H01L 29/7391 |
| 9,786,769 B2* | 10/2017 | Aleksov | ................ | H01L 29/7869 |
| 2006/0244077 A1* | 11/2006 | Nowak | ................ | H01L 29/7391 257/394 |
| 2008/0067495 A1* | 3/2008 | Verhulst | ................ | B82Y 10/00 257/12 |
| 2008/0067607 A1* | 3/2008 | Verhulst | ................ | B82Y 10/00 257/371 |
| 2008/0224224 A1* | 9/2008 | Vandenderghe | ................ | B82Y 10/00 257/365 |
| 2010/0123203 A1* | 5/2010 | Bhuwalka | ................ | H01L 29/7391 257/402 |
| 2012/0043607 A1* | 2/2012 | Luisier | ................ | H01L 29/7391 257/335 |
| 2012/0106236 A1 | 5/2012 | Singh et al. | | |
| 2012/0153263 A1* | 6/2012 | Chu-Kung | ................ | H01L 29/7391 257/24 |
| 2012/0228706 A1* | 9/2012 | Sugizaki | ................ | H01L 29/0657 257/345 |
| 2012/0298959 A1* | 11/2012 | Verhulst | ................ | B82Y 10/00 257/27 |
| 2013/0105763 A1 | 5/2013 | Yin et al. | | |
| 2013/0221407 A1* | 8/2013 | Hou | ................ | H01L 29/66803 257/192 |
| 2014/0054657 A1* | 2/2014 | Hokazono | ................ | H01L 29/78 257/288 |
| 2014/0158990 A1* | 6/2014 | Zhang | ................ | H01L 29/66356 257/39 |
| 2014/0175509 A1* | 6/2014 | Chu-Kung | ................ | H01L 29/66393 257/183 |
| 2015/0200289 A1* | 7/2015 | Zhang | ................ | H01L 29/7391 257/12 |
| 2015/0243769 A1* | 8/2015 | Goto | ................ | H01L 29/66356 257/9 |
| 2016/0064535 A1* | 3/2016 | Verhulst | ................ | H01L 29/7391 257/12 |
| 2016/0079415 A1* | 3/2016 | Sugizaki | ................ | H01L 29/7816 257/335 |

* cited by examiner

LAYERED STRUCTURE OF A P-TFET

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of European Patent Application No. EP 14188713.3, filed Oct. 13, 2014. The aforementioned application is incorporated by reference herein in its entirety, and is hereby expressly made a part of this specification.

FIELD OF THE INVENTION

A field effect transistor is provided, namely, a p-tunnel field-effect transistor and a circuit comprising such p-tunnel field-effect transistor.

BACKGROUND OF THE INVENTION

The metal-oxide-semiconductor field-effect transistor (MOSFET) technology, which forms the basic component of current integrated circuits, is reaching deep levels of miniaturization. The scaling occurs both for the geometrical dimensions as for the operating voltages, as this leads to better performance with a reduced footprint (reduced area on the chip stemming from dimension scaling) as well as reduction in power consumption per component (stemming from the voltage scaling). However, secondary effects of this miniaturization are noticeable. While scaling of geometrical dimensions is being continued, scaling of operating voltage is saturating, with leakage currents and heating issues being difficult to solve.

As a result of increasing leakage currents when scaling the supply voltage, the supply voltage is saturating and geometrical dimensions are currently being scaled faster than the supply voltage. This leads to an increase in short-channel effects, as the electric fields present in the devices become larger. Power density increases as well, increasing the demands on cooling.

The tunnel field-effect transistor (TFET) is a novel transistor concept intended to deliver improved performance at a lower supply voltage than a MOSFET, as a result of its capability of reaching sub-60 mV/dec subthreshold swing (SS). While the minimum voltage window to switch a transistor from OFF to ON state (subthreshold swing SS) has a theoretical limit of approximately 60 mV/dec at room temperature, the modern tunnel field-effect transistor (TFET) is capable of reaching sub-60 mV/dec SS values. In case of MOSFETs, the SS is impossible to reduce under 60 mV/dec, even assuming infinite gate-oxide capacitance, because the swing depends on the thermal energy in MOSFETs. This also limits the lower voltage of operation, rendering the MOSFET as sub-optimal for some low-power applications. The architecture and mode of operation of transistors have changed to other type of field-effects, e.g. the tunnel field-effect (TFE), to overcome this limit. While the basic doping profile of a MOSFET is, in general, "n i n", the basic profile of tunnel field-effect transistors (TFETs) is "n i p" or "p i n". Reaching sub-60 mV/dec SS is possible thanks to the TFET's working principle, which is based on band-to-band tunneling (BTBT), instead of on drift and diffusion like a MOSFET. Hence, the tunneling effect is the property which determines whether a transistor allows or prevents current from flowing. In a TFET, the charge carrier tunnels from the source to the channel region. The exponential tail of the Fermi-Dirac distribution of the carriers, responsible for the 60 mV/dec SS limit in a MOSFET, is cut off by the bandgap of the source material.

Of course, an effective and predictable tunneling is needed in order to obtain TFETs at least as reliable as their MOSFET counterparts. The challenge in case of TFETs is how to obtain a steep SS and a high on-current ($I_{ON}$).

TFETs, both n-type and p-type, have been verified experimentally, both in Si and III-V materials, but the SS and on-currents which are obtained today are insufficient, and the current models do not allow for an optimization of both parameters simultaneously. One of the ways that are being pursued to boost the on-current and decrease SS, is by the insertion of a counterdoped pocket next to the source region. This configuration is called a n-p-i-p or p-n-i-n TFET, for respectively the p-type and n-type transistor. The counter-doped pocket increases the electric field at the tunnel junction, resulting in more efficient tunneling and hence a larger on-current, combined with lower SS.

Despite the advances towards TFETs with high on-current and low subthreshold swing, integrated circuits for logic and memory applications comprising TFET are still sub-optimal because such transistors do not present good complementarity. Complementarity is needed to obtain a sufficiently low static power consumption. While TFETs with n-doped drains (n-TFETs) can reach a high on-current and good subthreshold swing, TFETs with p-doped drain (p-TFETs) present worse characteristics, even in the n-p-i-p configuration.

In order to obtain an effective tunneling, high on-current and low SS, the source and drain should be highly doped, thus increasing the electric field. A problem arising from a high doping level is an increase of degeneration level, which makes the semiconductor of the source act as a conductor rather than as a semiconductor. Among other problems, it has been shown that subthreshold swing is affected negatively by source degeneration. There have been solutions to provide effective tunneling, for example confinement by reducing the thickness of the transistors. The energetic distance between the conduction band edge and the electron Fermi level ($E_{FN}$) in the source can be somewhat reduced by this process. This method is sub-optimal and further improvement is desirable.

Other possibilities include heterostructures in the manufacture of TFETs. The heterojunction is usually the junction in which tunneling takes place (tunnel junction). By doing this, there is more optimization of the band structure and effective bandgap possible. For instance, the source may comprise a material with large bandgap, which typically implies a large density of states (DOS), and hence including a heterostructure may improve subthreshold swing. For the second material of the junction, also a large-bandgap material can be chosen. The effective bandgap, which is the energetic distance from valence band in the first material to the conduction band in the second material (n-TFET) or vice-versa for p-TFET, should be very small, so the materials must be carefully chosen for improving on-current over homogeneous junctions. The disadvantages of this technique are that the fabrication of these heterojunctions is complex, and the junction usually presents a relatively high density of stacking faults, dislocations and voids, due to the differences in material composition and, in some materials, also differences in crystal cell size for the different crystals structures. These faults tend to increase the off-current of the device, introduce new trap states, and even may change the band alignment, possibly leading to an increase in tunneling distance. Despite the possibility to use high DOS materials in the heterostructure, the DOS in the conduction band of typical III-V direct bandgap materials is still low, and degeneracy will occur at high doping regardless of defects and dislocation.

Hence, a different approach is needed.

SUMMARY OF THE INVENTION

It is an object of embodiments to provide a p-TFET that performs at least as well as n-TFETs. This means that it is an object of embodiments to provide a p-TFET with a low subthreshold swing and high on-current.

The above objective is accomplished by a device according to the embodiments.

In a first aspect, a p-type Tunnel Field-Effect Transistor (p-TFET) is provided comprising a drain p-type semiconductor region, a source n-type semiconductor region, and at least one gate stack. The source n-type semiconductor region comprises a lowly doped section with a length of at least 10 nm and with a doping level of n-type dopant elements below $5 \times 10^{18}$ at/cm³. The source n-type semiconductor region further comprises, in contact with the lowly doped section, a highly doped section with a length between 1 monolayer and 20 nm and with a doping level of n-type dopant elements above $5 \times 10^{18}$ at/cm³.

It is an advantage of embodiments that the source can have low doping levels, thus reducing doping degeneracy and reducing the energetic distance Ef-Ec, hence keeping subthreshold swing low. This is particularly advantageous for example for low power applications. It is an additional advantage that there is a large electrical field produced by the pocket formed by the highly doped section, improving tunneling and hence keeping a large on-current. The presence of the n-pocket allows to keep the electrical field high, while still in the remainder of the source the doping may be reduced.

In a p-type Tunnel Field-Effect Transistor according to embodiments, the junction between the lowly doped section of the source n-type semiconductor region and the highly doped section may be a homojunction. Hence the lowly doped section and the highly doped section may be made out of the same material, only having different doping levels. It is an advantage of embodiments that the fabrication of such TFET can be fast and easy. Furthermore, the off-current is low due to lack of interfacial dislocations.

A p-type Tunnel Field-Effect Transistor according to embodiments may further comprise a source contact. The lowly doped section of the source n-type semiconductor region may preferably be located completely between the highly doped section of the source n-type semiconductor region and the source contact. This way, current has to flow through the lowly doped section to reach the source contact.

A p-type Tunnel Field Effect Transistor according to embodiments may further comprise a channel between the drain p-type semiconductor region and the source n-type semiconductor region. The junction between the source n-type semiconductor region and the channel may be a heterogeneous junction. It is an advantage of embodiments that the on-current can be made larger due to appropriate band alignment.

Alternatively, the junction between the source n-type semiconductor region and the channel may be a homogeneous junction. An advantage thereof is the lack of interfacial trapping sites, and no band misalignment between source and channel region, hence maintaining the effectiveness of the tunneling effect.

A p-type Tunnel Field-Effect Transistor according to embodiments may further comprise, in contact with the source n-type semiconductor region, a layer of p-type doped semiconductor material with a length between 1 monolayer and 20 nm and with a doping level of p-type dopant elements above $5 \times 10^{18}$ at/cm³. It is an advantage of embodiments that the electric field can be higher than in prior art transistors in the tunneling region, thus improving the on-current, without negatively affecting SS.

In particular p-type Tunnel Field-Effect Transistors according to embodiments, the highly doped section of the source n-type semiconductor region and/or the layer of p-type doped semiconductor may have a length between 5 nm and 20 nm.

In a p-type Tunnel Field Effect Transistor according to embodiments, the layer of p-type doped semiconductor material may be in contact with the channel. It is an advantage of embodiments that the improvement of electric field can be applied to standard transistor architectures and processes available in the industry and in integrated circuit manufacture.

In embodiments, the gate stack does not overlap with the channel within 5 nm of the drain region. This way, the ambipolar current may be reduced.

In a p-type Tunnel Field-Effect Transistor according to embodiments, an overlap between the gate and the highly doped section of the source n-type semiconductor region does not amount to more than 1 nm. This way, the tunneling occurs at an improved, e.g. optimal, position relative to the channel and source.

In particular embodiments there is no overlap between the gate and the highly doped section of the source n-type semiconductor region.

In particular embodiments, the doping level of the source n-type semiconductor region may gradually increase so as to form the highly doped section. This way, the device can be manufactured more straightforwardly, e.g. by diffusion. If doping is applied during growth, which is the best solution for TFET, then supplementary thermal steps that are required to manufacture the remainder of the device, will automatically impose diffusion and hence generate gradients. Hence abrupt box-profiles are more difficult to implement.

In a second aspect, a circuit is provided comprising at least two complementary TFET devices, at least an n-TFET device and at least a p-TFET device, wherein the at least a p-TFET device comprises a p-type Tunnel Field-Effect Transistor according to embodiments. It is an advantage of embodiments that the n-TFET and p-TFET comprise more similar characteristics than if another p-TFET device, not in accordance with embodiments, would be used in the circuit.

A circuit according to embodiments may comprise an n-TFET and a p-TFET in complementary metal oxide semiconductor (CMOS) inverter configuration. It is an advantage of embodiments that such CMOS inverter configuration presents good complementarity.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other aspects of the present invention will be apparent from and elucidated with reference to the embodiment(s) described hereinafter.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

When using the term "tunneling field effect transistor (TFET)" throughout the text, reference is made to a semiconductor device in which a gate controls a source-drain current through modulation of the so-called Band-To-Band Tunneling (BTBT). Band-to-band tunneling is a process in which electrons tunnel from the valence band through the semiconductor bandgap to the conduction band or vice versa.

Where in embodiments reference is made to "drain", "source" and "gate", reference is made to the connections of the FET known in the art. The type of doping of the drain determines the type of TFET. In embodiments, the doped semiconductor corresponding to the drain has a p-type doping, hence reference will be made to a p-TFET.

Drain and source are associated with a physical region, often comprising at least one type of semiconductor. In particular embodiments, the present description may make reference to a drain semiconductor region and a source semiconductor region. For sake of simplicity, the terms drain region and source region will be used throughout the description.

Depending on the tunneling mechanism two types of TFETs may be distinguished: line TFET or point TFET. The tunneling mechanism of the line TFET device is dominated by so-called line tunneling which occurs inside the source region in a direction substantially orthogonal/perpendicular to the gate region, referred to as line tunneling. The tunneling mechanism of a point TFET device occurs partially inside the source region and partially inside the channel region in a direction substantially parallel to the gate region (45 degree or less), referred to as point tunneling.

When using the term 'dielectric constant', reference is made to the so-called 'absolute dielectric constant' $\in$ (also often referred to as permittivity) which is measured in farads per meter (F/m). $\in = \in r \times \in 0$ wherein $\in r$ is the relative dielectric constant of a material and $\in 0$ is the vacuum dielectric constant; $\in 0 = 8.8541878176 \times 10^{-12}$ F/m.

While some embodiments described herein include examples of a double-gate TFET device, more specifically a TFET device comprising for example a source-channel-drain structure in the plane of a semiconductor substrate, e.g. a horizontal source-channel-drain structure, and a double gate electrode situated on the sidewalls of the channel region of the horizontal source-channel-drain structure, also other implementations of TFET devices may be applied in embodiments, such as for example a single-gate, a tri-gate TFET, an all-round gate TFET, a nanowire TFET, . . . . A tri-gate TFET comprises a source-channel-drain structure in the plane of a semiconductor substrate, e.g. a horizontal source-channel-drain structure, and a triple gate electrode comprising three gate electrode parts situated respectively on the sidewalls and on top of the channel region of the horizontal source-channel-drain structure. A gate all-around TFET comprises a horizontal or a vertical source-channel-drain structure, i.e. a source-channel-drain structure in the plane of a substrate or substantially perpendicular to the plane of the substrate, and an all-around gate electrode situated around, i.e. surrounding or encircling, the channel region of the horizontal or vertical source-channel-drain structure. A nanowire TFET comprises a nanowire which forms at least the channel region, and optionally the channel region and one or more of the source and drain regions, and an all-around gate electrode structure around, i.e. surrounding or encircling, the channel region of the nanowire TFET.

Where in embodiments reference is made to a "layer of n-type or p-type doped semiconductor material" or to a "n-type or p-type pocket", reference is made to subregions or limited zones comprised in or adjacent to the source region. Any of these subregions, or both, do not need to comprise the whole area of the device's cross section, but may do so. These subregions or doped layers comprise semiconductor material with high concentration of doping atoms, hence the layers are said to have high doping levels. A first layer, in contact with the lowly doped section of the source and having n-type doping, will be referred to as "n-type pocket". An optional second layer, in contact with the highly doped section of the source and having p-type doping, will be referred to as "p-type pocket".

A first aspect of embodiments relates to a field-effect transistor, particularly to a p-TFET, comprising a drain region, a gate and a source region, although the transistor according to embodiments may present more parts.

In embodiments, the parts of the transistor may comprise semiconductors, for example at least one element of group IV materials like C, Si, Ge, a binary or ternary compound from group III/V materials like GaAs, InGaAs, InP, InAs, GaSb or mixes thereof. The embodiments are not limited to these examples, and it may comprise elements of group III/V materials such as In, Ga, As, Sb, Al, P, B, N and binary, tertiary and quaternary compounds thereof; or group II/VI materials such as Cd, Zn, S, Se, Te, O and binary, tertiary and quaternary compounds thereof; or even carbon nanotubes. In advantageous embodiments, small-gap materials are used, for instance small bandgap III-V materials, such as for instance InGaAs, InAs, InSb, preferably with direct bandgap.

A part of the transistor does not need to comprise the same elements as other parts, but may do so. For example, the source region, drain region and, if present, the channel may comprise the same composition (for instance all Si), with different types of doping in each of the parts. In particular embodiments, the drain region and the source region may comprise semiconductor materials which have opposite type of doping. In particular, the drain region may comprise a doped p-type semiconductor, and the source region may comprise a doped n-type semiconductor material.

In some embodiments, the part of the transistor separating the source and drain regions may comprise a channel, which may comprise a semiconductor material with low doping level, for example but not limited thereto, a lightly doped n-type or p-type semiconductor, or an intrinsic semiconductor. For example, the doping levels may be lower than $5 \times 10^{18}$ at/cm$^3$, for example between $10^{10}$ at/cm$^3$ (intrinsic doping) and $5 \times 10^{18}$ at/cm$^3$, preferably between $10^{15}$ at/cm$^3$ and $10^{17}$ at/cm$^3$, or lower than $10^{12}$ at/cm$^3$, for instance about $10^{10}$ at/cm$^3$. However, the presence of a channel is not an essential feature in every embodiment.

In certain embodiments, the TFET channel separates the drain region from the source region. In some embodiments the drain region, gate and source region may further comprise contacts, for example ohmic contacts, degenerated semiconductor (n or p) contacts, contact electrodes formed by deposition, buried electrodes, and may be part of an integrated circuit. The embodiments are not limited by any particular type of contact.

In embodiments, the drain region may comprise a p-type doped semiconductor. In particular embodiments, the doping level in the drain region may be low enough near the channel/drain interface to avoid ambipolar current. for example, the doping level of the drain region may be at least $10^{16}$ at/cm$^3$ and at most $5 \times 10^{20}$ at/cm$^3$, for example between $5 \times 10^{16}$ at/cm$^3$ and $5 \times 10^{18}$ at/cm$^3$, for example $5 \times 10^{17}$ at/cm$^3$. In some embodiments, it may have a similar doping level as the source. The embodiments are not limited by these values, and the range may be different for particular applications.

In some embodiments, the source region may comprise the same basic composition as the channel, for instance both source region and channel may comprise the same semiconductor material. The junction between source region and channel would be a homogeneous junction. The difference between source region and channel would lie in the doping level: the source region may have a higher doping level than the channel, for instance the source region may be doped and the channel may be an intrinsic semiconductor. A homogeneous junction presents several disadvantages over a heterogeneous junction. It may affect the characteristics of the TFET. For instance, the relation between the on-current and the off-current (the $I_{ON}/I_{OFF}$ coefficient, which is closely related to the subthreshold swing) can be several orders of magnitude lower than for a TFET comprising a typical heterogeneous junction under the same conditions. This depends on the particular case and composition, but the lower $I_{ON}/I_{OFF}$ is usually due to the requirement of a certain bandgap to obtain a low BTBT leakage (from source to drain e.g., or low ambipolar current). This bandgap may be too high to create sufficiently high on-currents. An advantage over heterostructure, which favors the performance of homogeneous junction devices, is the lower defect and dislocation density. However, the embodiments are not limited by any particular type of junction. For example, in some embodiments, source region and channel may comprise different semiconductor materials as basis materials, hence providing a heterogeneous junction at the tunneling region. Heterogeneous structures may present certain advantages, for example a bigger freedom of choice and tailoring of TFET characteristics. The materials may be chosen and, for instance, grown in order to reduce doping degeneracy, for instance by the use of a material with large bandgap for the source in combination with a relatively low doping level, while retaining a small effective bandgap at the tunnel junction, reducing tunnel distance and hence increasing the on-current.

In embodiments, the source region comprises an n-type doped semiconductor with low doping level, for example lower than $5 \times 10^{18}$ at/cm$^3$, for example between $10^{16}$ and $5 \times 10^{18}$ at/cm$^3$. The doping concentration of the source is kept low, such that the electron Fermi level $E_{FN}$ does not move too deeply into the conduction band. The strong reduction in doping degeneracy prevents the SS degradation seen in p-TFETs with a heavily doped source. For example, in embodiments comprising a channel, the SS degradation is prevented because around the condition where tunneling is allowed (this is: when conduction band in the source aligns with valence band in the channel), the Fermi-Dirac distribution in the source is such, that empty positions are available for electrons to tunnel from the channel into the source (or equivalently, for holes to tunnel from the source into the channel).

In accordance with embodiments, this low source doping is then combined with a highly-n-doped source pocket. The doping levels of the highly-n-doped source pocket are higher than $5 \times 10^{18}$ at/cm$^3$, preferably even not smaller than $2 \times 10^{19}$ at/cm$^3$. As the highly-n-doped source pocket has a large doping concentration, and as the highly-n-doped source pocket is depleted during the operation regime of the transistor, a large electric field builds up at the tunnel junction, which is stronger than it would be in the case with only a lowly doped source and no pocket. The stronger electric field hence enables a short tunnel path and hence a larger on-current.

In certain embodiments, the junction between the channel and the source region comprises two layers comprising doped semiconductor materials, the doped layers having opposite doping types. The layer in contact with the source region is the highly-n-doped source pocket as disclosed above, hence having the same type of doping as the source region, but at higher doping level. The second layer (in between the highly-n-doped source pocket and the channel) is a highly-p-doped pocket which has opposite, p-type, doping. In embodiments, also this p-type doped layer has a high doping level. For instance, the doping level may be higher than $5 \times 10^{18}$ at/cm$^3$, preferably higher than $2 \times 10^{19}$ at/cm$^{-3}$. Due to the additional presence of the highly-p-doped pocket, which is also partially depleted during device operation, a large electric field exists at the junction of the two pockets. The large field ensures efficient tunneling due to a short tunnel path and so an improved on-current.

Ideally, the highly-n-doped source pocket or, if present, the highly-p-doped pocket, or each of them, may be a layer with thickness between 1 monolayer and 20 nm, for instance a layer with thickness between 1 nm and 5 nm. The width of the pocket may be smaller if the doping level is higher. The minimum size and doping levels of the pockets should be enough to be able to produce a strong electric field, but the pockets should not be as wide as to generate carriers at an energy below the conduction band edge energy in the lowly doped region of the source, e.g. far from the source channel interface in those embodiments in which a channel is present. These carriers would degrade the SS, which would return to similar disadvantageous values as a highly doped conventional source configuration. The source may typically be longer than the n-type pocket, as the lower doping requires a longer thickness to regain the equilibrium band alignment with respect to the Fermi level and return to a state of non-accumulation and non-depletion (hence to a state of a semiconductor in equilibrium). For example, in some embodiments the source may be longer than 5 nm, for example longer than 10 nm, for example between 10 nm and 100 nm, the embodiments not being limited to such range.

In particular embodiments, the n-type pocket or n-type and p-type pockets completely cover the junction area between the source region and the channel. Hence, the lowly doped part of the source region is separated from the channel by the first (n-type) or by the first (n-type) and second (p-type) pockets. The embodiments are not limited thereto; for instance, the source region may be in direct contact with the channel, while limited zones of the junction comprise the one or two pockets, the n-type pocket being at least partially in contact with the source region. For example, in particular embodiments, the p-type pocket may be at least partially in contact with the channel.

A tunnel field effect transistor (TFET) according to embodiments may further comprise a gate stack, the gate stack being in direct contact with the channel region. The gate stack may comprise a gate electrode and a gate dielectric, for instance an oxide, the gate dielectric being located between the gate electrode and the channel. The gate stack may be aligned with the channel region, or there may be an overlap or an underlap with the regions neighboring the channel region. In particular embodiments, the gate stack extends along at least one of the sides of the channel, between the drain and the source regions. For example, the gate stack may overlap most of the channel except for a small part of the channel next to the drain, avoiding a gate-drain overlapping (providing gate-drain underlap). This may reduce the ambipolar current through the drain. In particular embodiments, the gate stack may partially or completely overlap the p-type pocket or/and the n-type pocket in between the channel and the source region. In particular advantageous embodiments, the gate stack overlaps about 1 nm with the n-type pocket, but also embodiments where the gate stack stops up to 5 nm before the pocket-channel interface are acceptable. In particular embodiments, the gate stack may even overlap a few nm with the lowly doped source region. In some embodiments, the gate stack may extend along the channel and also slightly overlap the source region. In particular embodiments, the gate stack does not extend along the complete length of the channel.

It is known that in p-type TFETs, high doping level in the source improves the effectiveness of the tunneling effect, hence keeping the on-current high. The negative effect of highly doped sources is the source degeneration: the Fermi level changes, and the difference between the Fermi level and the conduction band edge increases. Source degeneration produces subthreshold swing degradation in p-TFETs. One solution of this problem may be reducing the source doping, but this causes a drastic reduction of the on-current $I_{ON}$. Embodiments present a compromise between low source doping (avoiding subthreshold swing degradation) and effective tunneling (avoiding on-current degradation). Some embodiments may comprise a source comprising low doping, improving subthreshold swing, without the disadvantage of a reduced $I_{ON}$, due to the existence of the highly doped n-type and p-type pockets. These degenerate n- and p-type pockets are thin enough to have a minimal impact on the energetic distance between the Fermi level (determined by the external voltage applied) and the conduction band edge (determined by the doping levels), because the pockets will be nearly or fully depleted.

The general operation principles of a transistor according to embodiments will now be described.

In general, a TFET may comprise, according to embodiments, a drain comprising a p-type semiconductor material, a source comprising n-type semiconductor material in contact with a highly doped n-type semiconductor region, layer or section (highly doped n-type pocket), the n-type pocket situated in the region where tunneling is expected, and a gate. As a general outline, a voltage is applied to the TFET so the conduction band in the source changes and facilitates electron tunneling. Thanks to the low doping level of the source combined with the high doping level of the n-type pocket, the tunneling is effective due to the high electric field, and the degeneration is low, obtaining an improved SS. The interface between the n-type pocket and the source may be homogeneous (for instance, only differing in the level of doping, whereas the materials comprising both are the same), which facilitates manufacture.

The tunneling can be further improved by adding a highly doped p-type pocket in contact with the n-type pocket. When the voltage is applied, due to reduction of the concentration of free carriers in the pockets, the electric field is improved.

The basics of the embodiments may be applied to a diverse type of TFETs with different variations. For example, in case of TFETs with a channel separating the drain and the source, the source and the n-pocket may comprise a homogeneous junction, while the junction with the channel may be homogeneous or heterogeneous. The p-type pocket, if present, may be for example in the channel, or alternatively in the source, in contact with the n-type pocket. Hence, the embodiments may be easily implemented in standard manufacturing processes and circuit configurations, making integration in circuits straightforward.

The general principles of operation of embodiments comprising a channel are explained as follows.

When voltages are applied to the TFET, the band structure changes. In tunneling conditions, the conduction band in the source should align with the valence band in the channel. In a highly doped source region, there is a certain degeneration, and the distribution of carriers may impede effective tunneling of electrons from channel to source. On the other hand, due to the low source doping in case of embodiments, the Fermi-Dirac distribution still allows a large amount of empty positions in the source available for electrons immediately at onset, enhancing tunneling at the onset condition. A typical operation regime would result in partial depletion of the n-type and optionally p-type highly doped pockets, reducing the concentration of free carriers in the pockets. This depletion enhances electric field between the two pockets, and promotes tunneling at or near the junction between the channel and the source region. Additionally, the band energy suffers a limited potential dip due to the remaining carriers in the n-type pocket if not fully depleted. Due to the thin dimension of the pocket, the potential dip is narrow enough to allow quantized energy levels, such that even upon partial depletion, the carrier concentration at an energy below the conduction band far from the interface (carrier concentration in the potential dip) is very limited, preventing a re-establishment of the reduced SS associated with highly doped sources. The combination of these two factors (high doping of n- and optionally p-type pockets, and limited thickness) advantageously allows for a large on-current and steep SS.

The doping level of the n-type and optional p-type pockets is very high (degenerate), so the electric field between the two pockets during operation is also very high and may promote tunneling precisely in the region where this may be needed (e.g. near the junction between source region and channel, in some embodiments. Despite the degeneration of the pocket layers, the size of the pocket is limited and the subthreshold swing is not affected as negatively as in known devices. This enables a fabrication of source regions with doping levels which may be lower than in other known p-TFET devices.

Particular embodiments will now be described with reference to the figures.

Figure 1:
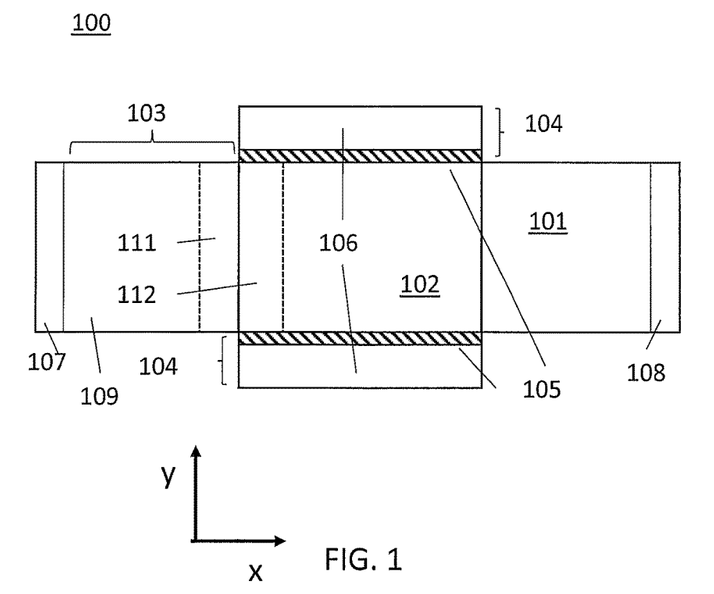
FIG. 1 is a schematic representation of a p-TFET with a channel, a p-type pocket and an n-type pocket in contact, near the tunneling region, according to particular embodiments.

A basic p-TFET according to some embodiments is shown in the schematic drawing of FIG. 1. The TFET 100 comprises a p-type doped drain region 101, a channel 102 separating the drain region from an n-type doped source region 103, and a double gate 104 in contact with the channel, the gate 104 comprising a gate dielectric layer 105, which for example may comprise an electric isolator like an oxide layer, and a gate electrode 106. The embodiments are not limited by this configuration, for instance, the TFET may comprise a triple gate or a gate all around the channel. The source region 103 comprises a lowly n-doped section 109, and in contact therewith a highly n-doped section 111. In the particular embodiment shown in FIG. 1, both a highly-n-doped pocket 111 and a highly-p-doped pocket 112 are provided. Both the n-type pocket 111 and the p-type pocket 112 extend over the complete interface surface between source region and channel. The doping profile of the TFET illustrated would be, in this particular example, "n− n+p+i p−". In the embodiment illustrated, a source contact 107 is provided in contact with the source region 103, and a drain contact 108 is provided in contact with the drain region 101. The embodiments are not limited by these examples, in particular it may be not limited by the presence of a p-type pocket or a channel.

The cross-section of the transistor (the area formed by the Y direction and the Z direction, the Z direction being perpendicular to the drawing plane in FIG. 1) can have any suitable shape; for instance it can be squared, rectangular, circular, oval, or the like.

The height of the device (Y-direction in FIG. 1) may for example be at least 3 nm, for instance between 3 nm and 1 μm, e.g. between 3 nm and a few 100 nm such as e.g. 300 nm, preferably between 3 nm and 100 nm, for example 10 nm. The embodiments may not be limited by these exemplary values, for example it may reach 1 micrometer.

The length of the drain region (X-direction in FIG. 1) may for example be at least 5 nm, for instance between 5 nm and 100 nm, for example 15 nm.

The channel, if present, can have a length (X-direction in FIG. 1) of at least 1 nm, for instance between 1 nm and 100 nm, such as between 5 nm and 100 nm, for example 30 nm. In some embodiments, for example, the channel can have a length of 50 nm. The minimal length of the channel is determined by the type of material used.

The lowly n-doped section 109 of the source region 103 can have a length (X-direction in FIG. 1) of at least 10 nm, for instance between 10 nm and 100 nm, for example 20 nm.

In advantageous embodiments, the length (X-direction in FIG. 1) of the n-type pocket 111 or the p-type pocket 112, or each of them, may range from the thickness of one monolayer to lower than 20 nm, for example up to 5 nm. Both pockets, if present, may have the same length or a different length, depending on the particular application and the characteristics needed. In some embodiments, the lowly doped source may be longer than the n-type pocket.

In the embodiment illustrated in FIG. 1, the gate electrode stack has a length (X-direction in FIG. 1) substantially equal to the length of the channel 102. In this embodiment, the gate electrode 106 and the gate dielectric 105 have a same length. This, however, is not limiting for the embodiments. In particular embodiments, the gate dielectric 105 may extend beyond the gate electrode 106. In particular embodiments, the length of the gate electrode 106 may be between 5 nm and 100 nm, for example 22 nm. In alternative embodiments the gate electrode 106 may have a length smaller or larger than the length of the channel 102. This means that the gate electrode 106 does not need to cover the complete length of the channel 102, but may do so and may even cover more than the length of the channel 102. The gate electrode 106 may also cover other parts of the transistor, for instance it may overlap with one or more (if present) of the pockets 111, 112, or even with the lowly doped section 109 of the source region 103, and this both in cases where it covers or does not cover the complete length of the channel 102. In one direction, the gate electrode 106 may extend up to the drain—channel interface, or up to a distance from the drain—channel interface in the direction of the channel. In the other direction, the gate electrode 106 extends at least up to a distance not more than 5 nm from the pocket—channel interface, but in embodiments it may extend up to the pocket—channel interface, beyond the pocket—channel interface, or even up to a few nm beyond the pocket—source region interface. In some embodiments, depending for example on manufacturing process, or depending on particular applications, it may be advantageous not to have an overlap between the gate electrode 106 and the n-type pocket 111. For example, in certain embodiments the gate electrode 106 may overlap the p-type pocket completely, but the edge of the gate electrode 106 may be situated at the level of the interface between the p-type pocket and the n-type pocket, not overlapping the n-type pocket.

Figure 2:
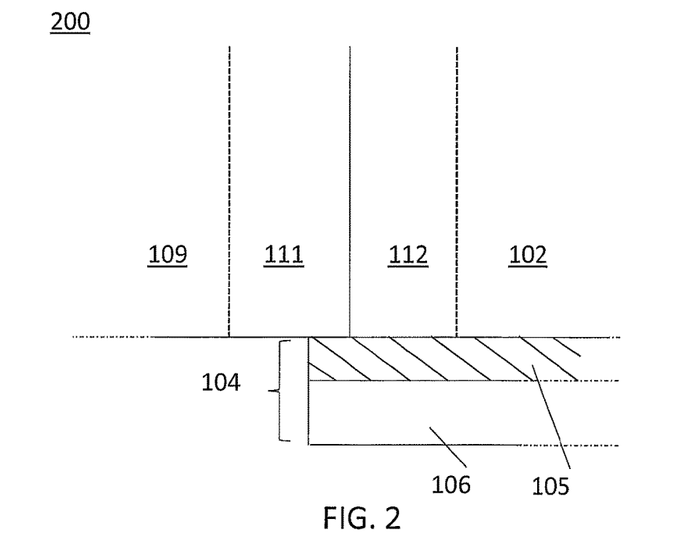
FIG. 2 shows a slight overlapping between the gate and the n-type pocket according to some embodiments.

In other embodiments, as illustrated in FIG. 2, the gate electrode 106 (in the embodiment illustrated the gate stack 104) may slightly overlap the n-type pocket. The detail of the junction 200 shows that the gate electrode 106 may partially or completely overlap the channel 102, and the edge of the gate electrode 106 may be situated at a certain distance of the p-type pocket 112, completely overlapping said layer, but only partially overlapping the n-type pocket 111. The optimal overlapping depends on the relative thickness of the pockets and the body. In the embodiments with dimensions shown in the Table I, the gate electrode may extend about 1 nm over the n-type pocket.

Band structure simulations have been performed using the architecture of FIG. 2, using a homogeneous pocket length of 10 nm and the values of doping levels and region lengths enumerated in Table I. The embodiments are not limited by the thickness of the device, which may be chosen according to the material to obtain an optimal confinement, for example confined down to a distance in which the optimal $I_{ON}/I_{OFF}$ ratio is achieved.

TABLE I

| Simulated configuration details | |
|---|---|
| $N_{SOURCE}$ [at/cm$^3$] | $10^{18}$ |
| $N_{CHANNEL}$ [at/cm$^3$] | $10^{10}$ |
| $P_{DRAIN}$ [at/cm$^3$] | $5 \times 10^{17}$ |

TABLE I-continued

| Simulated configuration details | |
|---|---|
| $N_{POCKET}$ [at/cm$^3$] | $5 \times 10^{19}$ |
| $P_{POCKET}$ [at/cm$^3$] | $5 \times 10^{19}$ |
| $L_{SOURCE}$ [nm] | 20 |
| $L_{CHANNEL}$ [nm] | 50 |
| $L_{DRAIN}$ [nm] | 15 |
| $L_{GATE}$ [nm] | 22 |
| $L_{GN}$ [nm] | 1 |
| EOT [nm] | 0.6 |
| WF [eV] | 5 |

For this particular simulation, the drain, source and channel comprise InGaAs. The channel is slightly doped with n-type doping, with similar behavior as an intrinsic semiconductor. Also the type and level of doping (N or P) in each of the regions is indicated in the Table I. The length of each region is indicated, as well as the overlap $L_{GN}$ between the gate electrode 106 and the n-type pocket (which corresponds to the embodiment of FIG. 2). EOT means Equivalent Oxide Thickness of the gate dielectric 105 and WF represents the Work Function.

Figure 3:
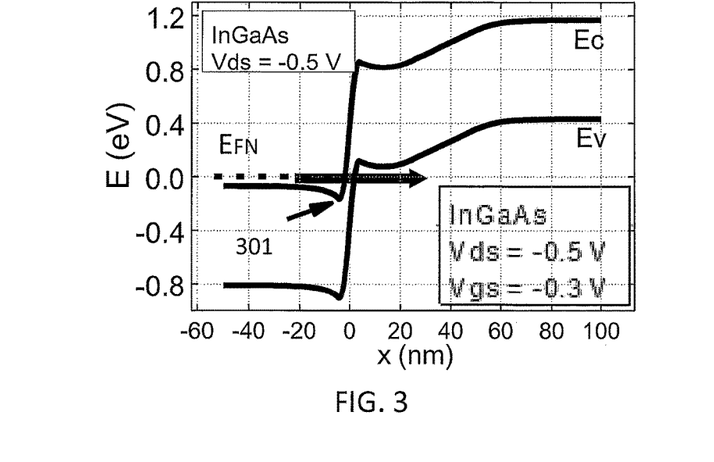
FIG. 3 shows a band diagram along the body center from source to drain, illustrative for the channel/source junction according to some embodiments.

The results of the simulated band structure can be seen in FIG. 3. The gate-source and drain-source voltages are −0.3 V and −0.5 V respectively. There is a potential dip 301 due to the existence of the highly doped, but relatively thin (few nm), n-type and p-type pockets 111, 112 between the lowly doped section 109 of the source region 103 and the channel 102. This potential dip 301 is narrow, so the available levels are quantized, hence advantageously retaining a low carrier concentration in the n-type pocket.

Tunneling of holes follow the arrow from the conduction band in the lowly doped section 109 of the source region 103 to valence band of the channel 102.

It can also be seen in FIG. 3 that the difference between the conduction band edge $E_C$ and the Fermi level $E_{FN}$ is approximately 100 meV for the values of Table I and the applied voltages of gate-source and drain-source voltages are −0.3 V and −0.5 V, respectively. If the doping level of the source was $5 \times 10^{19}$ at/cm$^3$ instead of $10^{18}$ at/cm$^3$, this difference would have been about 500 meV, degrading subthreshold swing. This is an example of the advantage of a source with low doping levels in accordance with embodiments.

The simulations also provide substantial information regarding the on-current and the subthreshold swing for a TFET with the configuration of FIG. 2, for different sizes of the layers and for an on-current defined according to an off-current of 1 nA/μm (one nano-ampere per micrometer) and a supply voltage of 0.5 V. The results of a) the on-current ($I_{ON}$) and b) the largest current for which the subthreshold swing is lower than 60 mV/dec ($I_{60}$) are shown in Table II, and the last row provides with comparison with an existing TFET with the same p-pocket doping level as the examples.

The obtained results take into account a size of 5 nm for the n-type pocket and sizes of 3 and 4 nm for the p-type pocket. These $I_{ON}$ values are, not only comparable with optimized TFETs known in the art, but the existing and large $I_{60}$ also indicates an improvement of the on-current for smaller supply voltages over existing TFETs (last row table), for which the $I_{60}$ current is typically negligible or non-existing, (hence SS is higher than 60 mV/dec for the TFET known in the art).

TABLE II

Comparison of $I_{ON}$ and $I_{60}$

| Configuration/$L_{SOURCE}$/$L_N$/$L_P$ | $I_{ON}$ [µA/µm] | $I_{60}$ [µA/µm] |
|---|---|---|
| n– n+ p+ i p–/10 nm/5 nm/ 4 nm | 75 | 5 |
| n– n+ p+ i p–/10 nm/5 nm/3 nm | 60 | 2 |
| n+ p+ i p–/10 nm/0 nm/3 nm | 75 | — |

Figure 4:
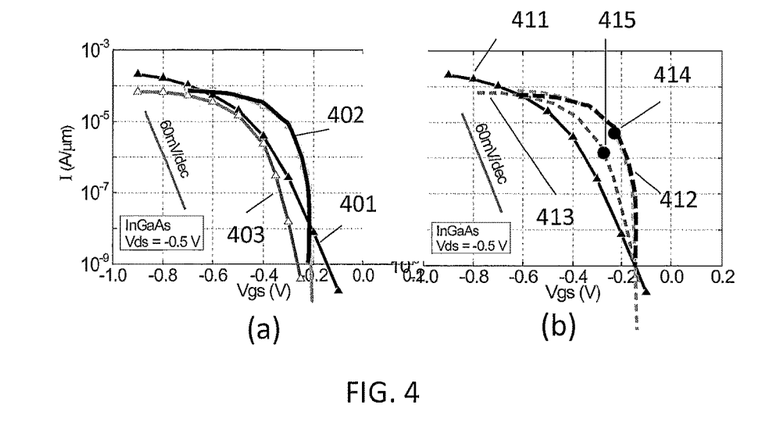
FIG. 4 shows simulations of the current vs. gate-source potential for a particular configuration according to embodiments, compared to an optimized known (prior art) TFET, and its shifted values for the same off-current.

The input characteristics are plotted in FIG. 4 as a function of the gate-source voltage ($I_{DS}$ vs $V_{GS}$). The graphs in part (a) of FIG. 4 show the simulated unshifted I-V currents 401 for an optimized known TFET (last entry in Table II), compared to two TFETs according to embodiments, with features an in Table I and FIG. 1 with an n-type pocket size of 5 nm, one plot 402 corresponding to a TFET having a p-type pocket of 4 nm, and another plot 403 corresponding to a TFET having a p-type pocket of 3 nm. The graphs in part (b) of FIG. 4 are the same as the graphs in part (a), with shifted voltage characteristics such that an off-current of 1 nA/µm is obtained at the same voltage for the three cases. Analogously as in the unshifted graphs, the shifted graphs show a comparison between the plots 411 for the optimized prior art TFET and two TFETs according to embodiments, one plot 412 corresponding to a TFET having a p-type pocket of 4 nm, and another plot 413 corresponding to a TFET having a p-type pocket of 3 nm. The subthreshold swing is improved in the two cases according to embodiments. The marks 414, 415 in the plots 412, 413 correspond to the values of $I_{60}$ shown in Table II (these values are only existing in the TFETs according to embodiments).

The graphs show that a preferred choice of p-type pocket size would be 4 nm, for the configuration of FIG. 1 with an n-type pocket size of 5 nm.

As it can be seen from the simulations, the embodiments may advantageously provide a p-TFET with a large on-current, comparable to that of previously known TFETs (TFETs with heavily doped source), in addition to avoiding the deterioration of subthreshold swing caused by large doping degeneracy.

Despite the simulations relate to embodiments shown in previous drawings, the embodiments may also be applied to other transistor configurations.

Figure 5:
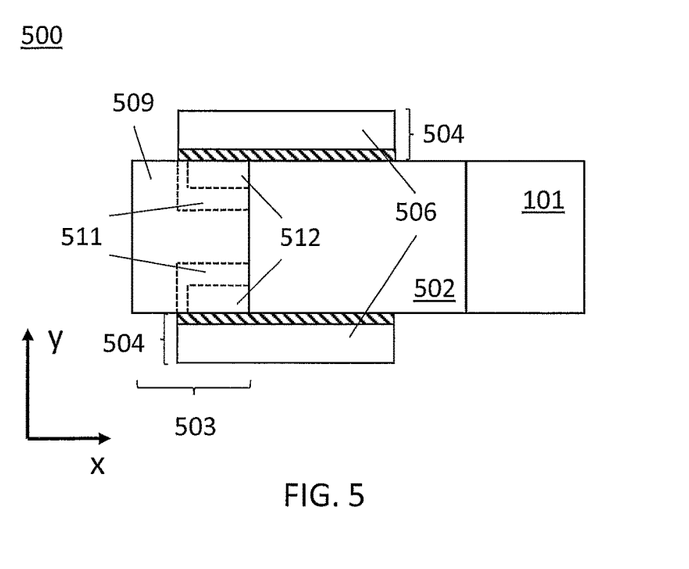
FIG. 5 schematically illustrates a particular embodiment according to a line TFET configuration.

FIG. 5 is a schematic illustration of a TFET 500 according to embodiments following a line TFET configuration. The line TFET configuration increases the electric field near the junction, facilitating the tunneling event from the conduction band to the valence band. The presence of a p-type pocket also reduces field-induced quantum confinement.

As before, a drain region 101, possibly with a drain contact (not illustrated in FIG. 5), is in contact with a channel 502, but in this case the n-type pocket 511 and p-type pocket 512 do not occupy the complete area in which the channel 502 and the lowly doped section 509 of the source region 503 may be in direct contact. This is different from the embodiment of FIG. 1, where there was no direct contact between the lowly doped section 109 of the source region 103 and the channel 102, as both pockets 111, 112 occupied the whole area between them. In both the embodiments of FIG. 1 and FIG. 5, the tunneling takes place partially inside the n-type pocket 511, and the dominant electric field is mainly perpendicular to the pocket layers, but this configuration does not limit the embodiments, and other configurations may show different behaviors.

While the dominant electric field could be defined in FIG. 1 as parallel to the gate 104 (the gate being perpendicular to the n-type and p-type pockets 111, 112), in the configuration of FIG. 5, the electric field can be defined as perpendicular to the gate 504 (and the pockets 511, 512 parallel to the gate 504). The tunneling effect may be described as being orthogonal to the gate 504. In some embodiments following the line TFET configuration, the lowly doped section 509 of the source region 503 may present a low doping level, not higher than $5\times10^{18}$ at/cm$^3$, and the junction with the channel 502 comprises at least one pocket layer comprising a highly doped semiconductor material.

The gate electrode 506 may extend over the n-type and optionally present p-type pockets, and it may extend over at least part of the channel 502, up to the drain region 101, which may also be overlapped, or may advantageously not be overlapped. In alternative embodiments, the gate electrode 506 may not overlap the channel 502, extending over only at least part of the n-type pocket 511 and, if present, the p-type pocket 512. In the particular configuration illustrated in FIG. 5, the gate electrode 506 extends (X-direction in FIG. 5) along a portion of the channel 502. The length (in the X-direction in FIG. 5) of the pockets 511, 512 may extend over a substantial length (in the X-direction in FIG. 5) of the source region 503, for example about 5 nm, or for example about 10 nm. In certain embodiments, the pockets may not extend completely up to the source contact, but they may extend over a substantial part thereof, for instance at least 90% of the total length of the source, or even more, for example at least 95% thereof. The height (in the Y-direction in FIG. 5) of the pockets 511, 512 may be, as before, less than 20 nm, for example it may be about 5 nm (measured from the gate towards the center of the device). The p-type pocket 512 may be partially embedded within the n-type pocket 511, but other configurations are possible. The p-type pocket 512 may be smaller than 20 nm, for example 5 nm or less. The p-type pocket 512 is in contact with the gate stack 504, with the n-type pocket 511, and over a small surface with the channel 502. The n-type pocket 511 is in contact with the lowly doped section 509 of the source 503, the p-type pocket 512, and over a small surface with the channel 502 and optionally with the gate 504. The n-type pocket 511 can be at least partially, or even completely, as shown in the FIG. 5, overlapped by the gate 504.

In particular embodiments, the doping profile of the source and drain regions can be advantageously manipulated according to each particular application. For example, the source region may comprise a highly doped (e.g. degenerated) zone with the functionality of a contact, hence effectively creating a "n+ n– n+ p+ i p–" doping profile.

Figure 6:
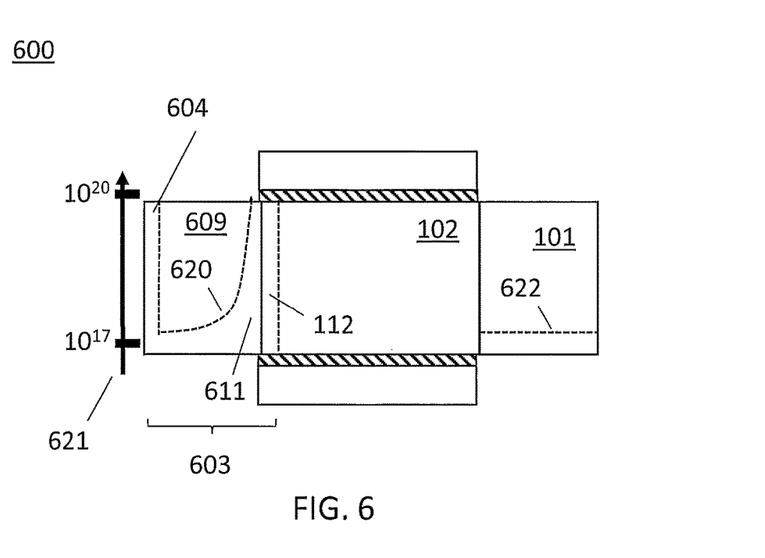
FIG. 6 schematically illustrates a transistor of which the source presents a doping profile with a gradient, according to particular embodiments.

In particular embodiments, schematically illustrated in FIG. 6, a TFET 600 comprises a source 603 which may be prepared so the doping level increases across its length towards the channel 102. At the point in which the source region 603 is in contact with the p-type pocket 112, the source region 603 has a high doping level, higher than $5\times10^{18}$ at/cm$^3$, creating effectively a highly-doped n-type pocket 611. Alternatively, in those embodiments in which the p-type pocket or channel is not present, the source region has a high doping level in the in zone in which the tunneling effect is expected. The increment of doping level across the length of the source region 603, indicated by the hatched line 620, may be linear, or in advantageous embodiments, exponential, asymptotic or may have any other profile which may keep a low doping level, below $5\times10^{18}$ at/cm$^3$, in a lowly doped section 609, wherein the lowly doped section 609 corresponds to most of the source region 603, for instance in at least 50% of the source region, or at least 70% of the source region (these exemplary values not limiting the embodiments), while having a high doping level, e.g. higher than $5\times10^{18}$ at/cm$^3$, in the zone 611 closer to the channel 102 where tunneling is expected. The scale 621 relates to the hatched lines 622, 620 in drain region 101 and source region 603, respectively, and indicates the doping levels in these regions, either p or n doping. The source region 603 has n-type doping, and the drain region 101 has p-type doping.

Additionally, in some embodiments, for instance illustrated in the embodiment of FIG. 6, but not limited thereto, the source region 603 may comprise a highly doped area 604 with the functionality of a contact, as explained before. This is optional and not limiting to the embodiments.

The embodiments are not limited by any particular configuration shown in these particular examples and embodiments, and it can be applied to other transistor configurations like raised-buried oxide TFETs, gate-all-around TFETs, single or multi-gate TFETs, FinFETs, horizontal or vertical TFETs, etc. The cross section may be cylindrical, planar, oblong, etc.

Another aspect of embodiments relates to a circuit which may comprise at least two transistors, at least one of them being a p-TFET according to embodiments of the first aspect of the embodiments. In particular embodiments, the circuit may be an integrated circuit, for example comprising the architecture of a CMOS design, with applications in logic, although the embodiments are not limited thereby, and the embodiments can be equally applied to memory devices, like 3T or 4T memories. It is an advantage of the CMOS design according to embodiments that the transistors show good complementarity, as the p-TFET according to embodiments may present characteristics (for example, subthreshold swing and on-current) similar to those found in n-TFETs. Thus, integrated circuits with CMOS structure based on MOSFET technology can be substituted by TFET, which shows lower subthreshold swing SS than the limited MOSFET SS. Because of improved complementarity, CMOS circuits comprising p-TFETs according to embodiments would use less power and show less leakage current and higher on-current than existing TFET-based CMOS circuits. Existing CMOS processes can advantageously be used for complementary TFET circuit manufacture, making technology transfer easy.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' including but not limited to,' or the like; the term 'comprising' as used herein is synonymous with 'including,' containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality.

All numbers expressing dimensions, amounts, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A p-type tunnel field-effect transistor, comprising:
a drain p-type semiconductor region;
a source n-type semiconductor region comprising a lowly doped section and a highly doped section, wherein the lowly doped section has a length of at least 10 nm and a first n-type doping level of below $5\times10^{18}$ at/cm$^3$, wherein the highly doped section has a length of greater than 0 nm and up to 20 nm and has a second n-type doping level of above $5\times10^{18}$ at/cm$^3$, and wherein the lowly doped section is in contact with the highly doped section;

a channel region between the drain p-type semiconductor region and the source n-type semiconductor region, the channel region comprising a channel portion and a layer of p-type doped semiconductor material, wherein the layer of p-type doped semiconductor layer has a length of greater than 0 nm and up to 20 nm and has a p-type doping level of above $5\times10^{18}$ at/cm$^3$, wherein the layer of p-type doped semiconductor material is in contact with the channel portion and is in contact with the highly doped section; and at least one gate electrode covering at least apart of the channel portion while avoiding a gate-drain overlapping and a gate-source overlapping, wherein an edge of the gate electrode is vertically aligned with a boundary between the source n-type semiconductor region and the channel region.

2. The p-type tunnel field-effect transistor of claim 1, wherein a junction between the lowly doped section and the highly doped section is a homojunction.

3. The p-type tunnel field-effect transistor of claim 1, further comprising a source contact, wherein the lowly doped section is located completely between the highly doped section and the source contact.

4. The p-type tunnel field-effect transistor of claim 1, wherein a junction between the source n-type semiconductor region and the channel region comprises a heterogeneous junction.

5. The p-type tunnel field-effect transistor of claim 1, wherein a junction between the source n-type semiconductor region and the channel region comprises a homogeneous junction.

6. The p-type tunnel field-effect transistor of claim 1, wherein the gate electrode comprises a double gate in contact with the channel region.

7. The p-type tunnel field-effect transistor of claim 1, wherein the gate electrode has a length equal to a length of the channel region.

8. The p-type tunnel field-effect transistor of claim 1, wherein the p-type tunnel field-effect transistor is a point tunneling field-effect transistor.

9. The p-type tunnel field-effect transistor of claim 1, wherein the gate electrode completely overlaps the layer of p-type doped semiconductor material.

10. The p-type tunnel field-effect transistor of claim 1, wherein the lowly doped section comprises at least 50% of the source n-type semiconductor region.

11. The p-type tunnel field-effect transistor of claim 1, wherein the lowly doped section comprises at least 70% of the source n-type semiconductor region.

12. The p-type tunnel field-effect transistor of claim 1, wherein the at least one gate electrode covers a complete length of the channel region.

13. A circuit, comprising:
at least two complementary tunnel field-effect transistor devices, the at least two complementary tunnel field-effect transistor devices comprising an n-type tunnel field-effect transistor device and a p-type tunnel field-effect transistor device, wherein the p-type tunnel field-effect transistor comprises:
a drain p-type semiconductor region;
a source n-type semiconductor region comprising a lowly doped section and a highly doped section, wherein the lowly doped section has a length of at least 10 nm and a first n-type doping level of below $5\times10^{18}$ at/cm$^3$, wherein the highly doped section has a length of greater than 0 nm and up to 20 nm and has a second n-type doping level of above $5\times10^{18}$ at/cm$^3$, and wherein the lowly doped section is in contact with the highly doped section;
a channel region between the drain p-type semiconductor region and the source n-type semiconductor region, the channel region comprising a channel portion and a layer of p-type doped semiconductor material, wherein the layer of p-type doped semiconductor material has a length of greater than 0 nm and up to 20 nm and has a p-type doping level of above $5\times10^{18}$ at/cm$^3$, wherein the layer of p-type doped semiconductor material is in contact with the channel portion and is in contact with the highly doped section; and
at least one gate electrode covering at least a part of the channel portion while avoiding a gate-drain overlapping and a gate-source overlapping, wherein an edge of the gate electrode is vertically aligned with a boundary between the source n-type semiconductor region and the channel region.

14. The circuit of claim 13, wherein the n-type tunnel field-effect transistor device and the p-type tunnel field-effect transistor device are in a complementary metal oxide semiconductor inverter configuration.

* * * * *

UNITED STATES PATENT AND TRADEMARK OFFICE
CERTIFICATE OF CORRECTION

PATENT NO. : 10,211,287 B2
APPLICATION NO. : 14/880667
DATED : February 19, 2019
INVENTOR(S) : Devin Verreck et al.

Page 1 of 1

It is certified that error appears in the above-identified patent and that said Letters Patent is hereby corrected as shown below:

In the Specification

In Column 17 at Line 63, Change "including" to --'including--.

In Column 17 at Line 65, Change "containing,'" to --'containing,'--.

In Column 18 at Line 11, Change "preferred,'" to --'preferred,'--.

In the Claims

In Column 19 at Line 15 (Approx.), In Claim 1, change "apart" to --a part--.

Signed and Sealed this
Fourteenth Day of May, 2019

Andrei Iancu
*Director of the United States Patent and Trademark Office*